(12) United States Patent
Lambert et al.

(10) Patent No.: US 7,679,952 B2
(45) Date of Patent: Mar. 16, 2010

(54) ELECTRONIC CIRCUIT WITH A MEMORY MATRIX

(75) Inventors: Nicolaas Lambert, Waalre (NL); Victor Martinus Gerardus Van Acht, Waalre (NL); Pierre Hermanus Woerlee, Valkenswaard (NL); Andrei Mijiritskii, Zaltbommel (NL)

(73) Assignee: NXP B.V., Eindhoven (NL)

( * ) Notice: Subject to any disclaimer, the term of this patent is extended or adjusted under 35 U.S.C. 154(b) by 71 days.

(21) Appl. No.: 12/096,226

(22) PCT Filed: Dec. 4, 2006

(86) PCT No.: PCT/IB2006/054583

§ 371 (c)(1),
(2), (4) Date: Jun. 11, 2008

(87) PCT Pub. No.: WO2007/066276

PCT Pub. Date: Jun. 14, 2007

(65) Prior Publication Data

US 2008/0316805 A1       Dec. 25, 2008

(30) Foreign Application Priority Data

Dec. 7, 2005   (EP) .................... 05111777

(51) Int. Cl.
*G11C 16/02* (2006.01)
*H01L 27/105* (2006.01)

(52) U.S. Cl. .................... 365/163; 365/96; 365/100; 365/148

(58) Field of Classification Search .......... 365/163
See application file for complete search history.

(56) References Cited

U.S. PATENT DOCUMENTS

| | | | |
|---|---|---|---|
| 6,768,689 B2 * | 7/2004 | Origasa | 365/189.11 |
| 6,937,505 B2 * | 8/2005 | Morikawa | 365/158 |
| 7,145,795 B2 * | 12/2006 | Ghodsi | 365/158 |
| 7,248,498 B2 * | 7/2007 | Nazarian | 365/171 |
| 7,349,235 B2 * | 3/2008 | Miyatake et al. | 365/66 |
| 2002/0006058 A1 * | 1/2002 | Nakajima et al. | 365/171 |
| 2004/0184331 A1 | 9/2004 | Hanzawa et al. | |
| 2005/0122768 A1 | 6/2005 | Fukumoto | |

FOREIGN PATENT DOCUMENTS

| | | |
|---|---|---|
| EP | 1580762 A2 | 9/2005 |
| EP | 1630817 A2 | 3/2006 |
| WO | WO 03085675 A2 | 10/2003 |
| WO | WO 2005066969 A1 | 7/2005 |

* cited by examiner

*Primary Examiner*—Son L Mai

(57) ABSTRACT

In an example embodiment, an electronic circuit comprises a memory matrix with rows and columns of memory cells. First row conductors are provided for each of the rows. Second row conductors correspond to pairs of rows, each successive row forming a respective pair with a preceding one of the rows, so that each pair overlaps with one row of the next pair. Column conductors are provided for each of the columns. Each of the memory cells comprises an access transistor, a node and a first and a second resistive memory element. The access transistor has a control electrode coupled to the first row conductor of the row of the memory cell, a main current channel coupled between the column conductor for the column of the memory cell and the node. The first and second the resistive memory element are coupled between the node and the second row conductors for the pairs of rows to which the memory cell belongs.

11 Claims, 4 Drawing Sheets

ELECTRONIC CIRCUIT WITH A MEMORY MATRIX

The invention relates to an electronic circuit with a memory matrix.

A major design goal for memory matrices is to reduce average area per bit, i.e. the ratio between matrix area and the number of stored bits in the matrix, to a minimum value. US patent application no 2004/184331 describes a memory matrix with memory cells that comprise an access transistor with a main current channel in series with a resistive memory element, such as a phase change element. Row conductors are provided, each for a respective row of cells and the gates of the access transistors of cells in a row are connected to the row conductor for the row. A pair of column conductors is provided for each row and the series arrangements of the channel of the access transistor and the resistive memory element of the cells in the column are coupled between the pair of column conductor. Both column conductors in each pair are selectably coupled to driver circuits via a switch; alternatively one of the column conductors in each pair is a ground conductor.

US patent application no 2004/184331 mentions the possibility of implementing the access transistors as vertical transistors. In a vertical field effect transistor the channel is formed by a semi-conductor body of limited horizontal extent (e.g. a vertical cylinder), which extends vertically from a column conductor structure. A gate conductor is provided horizontally adjacent to the body. Typically the body extends through a hole in a row conductor that forms the gate electrode.

A phase change material is provided on top of the body. On top of the phase change material a second column conductor is provided. The resistance of the material phase change material depends on the waveform applied during a last write action. The cell is read by measuring the resistance between the column conductors when the row conductor of a selected row is driven so that the access transistors in a selected row become conductive.

Although US patent application no 2004/184331 provides for a compact memory structure, it is desirable to decrease the average area per bit even further.

Among others it is an object of the invention to provide for a memory structure with low average area per bit.

An electronic circuit according to claim is provided. Herein each memory cell comprises an access transistor with a control electrode coupled to a first row conductor and a first and second resistive memory element coupled between the main current channel of the access transistor and respective second row conductors. The resistive memory elements may be fuses, anti-fuses, elements comprising reversible phase change material or hysteresis material for example. Thus a single transistor is used to access the first and second resistive memory element, which can store independent information. This is particularly useful when the access transistors are realized as vertical transistors, because the increased size needed for using the first row conductor as control electrode for a vertical channel allows for the use of two resistive memory elements per access transistor instead of one with little or no area penalty. In addition to the mentioned cells with a first and a second resistive memory element other cells may be present in the matrix, for example at the edge, which may contain only one such element.

In an embodiment respective mutually different first and second voltage to all second row conductors are applied on mutually opposite sides of the selected one of the rows respectively during access. This saves power consumption due to parasitic currents.

These and other objects and advantageous aspects will be described for exemplary embodiments, using the following Figures.

Figure 3A:
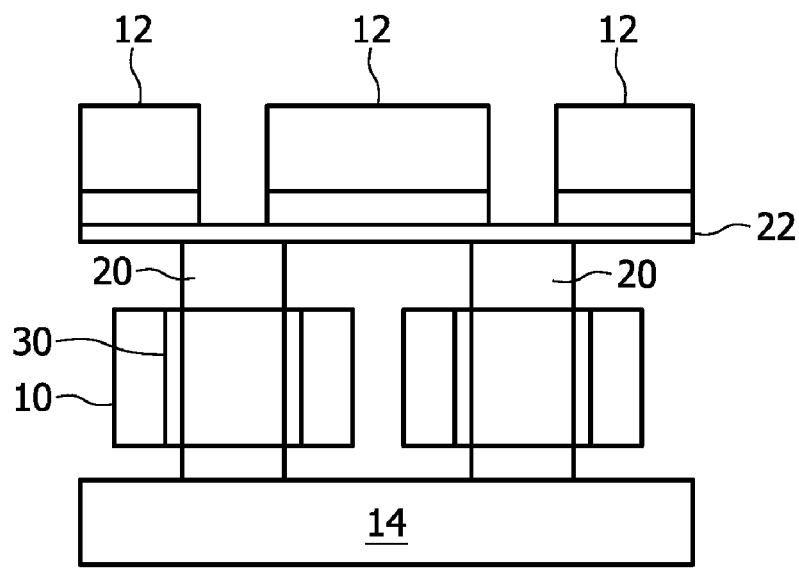
Figure 3B:
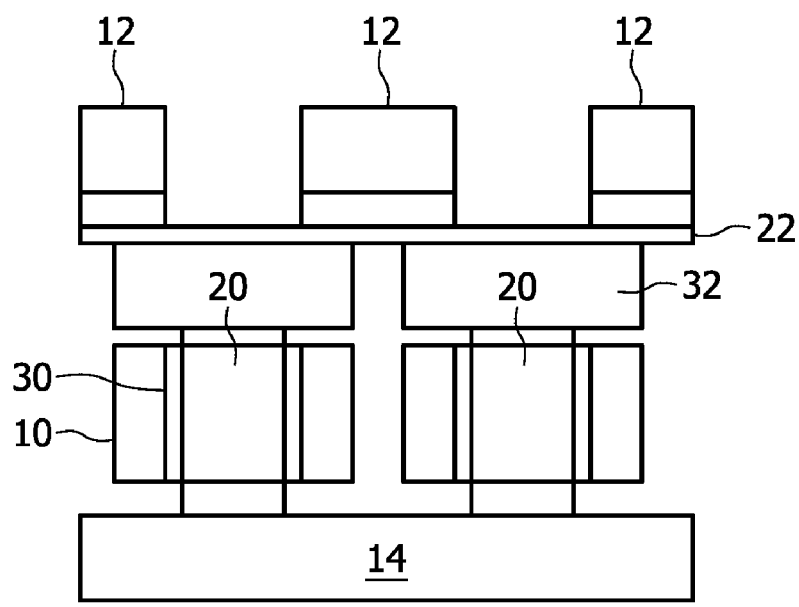

FIG. 3*a*-*b* show a cross-section of a memory matrix

Figure 4:
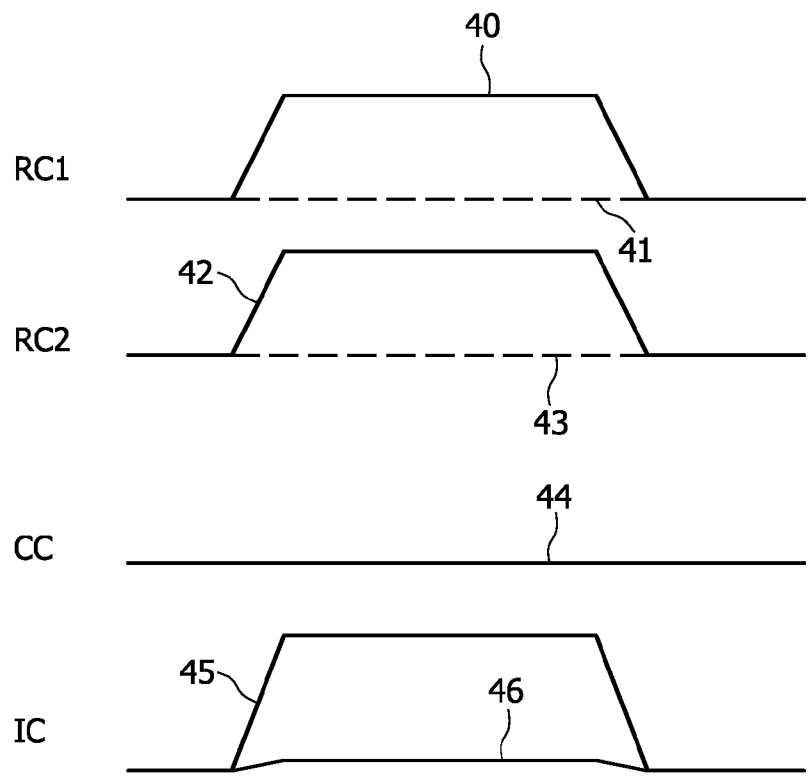

FIG. 4 shows read signals

Figure 5:
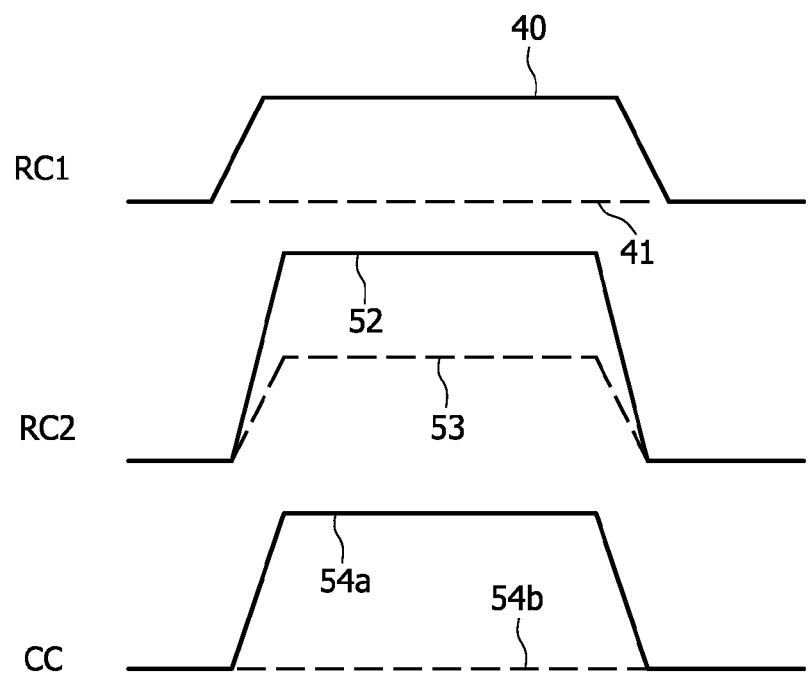
Figure 5A:
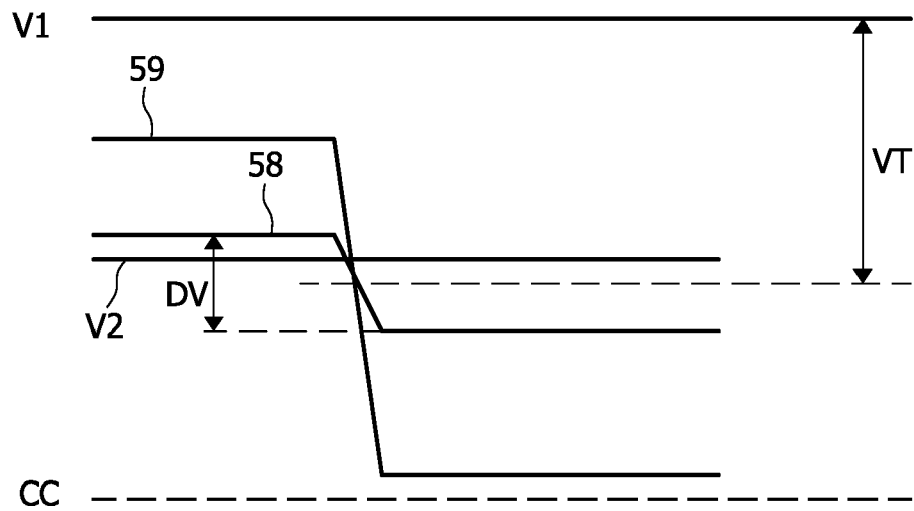

FIGS. 5, 5*a* show write signals

Figure 6:
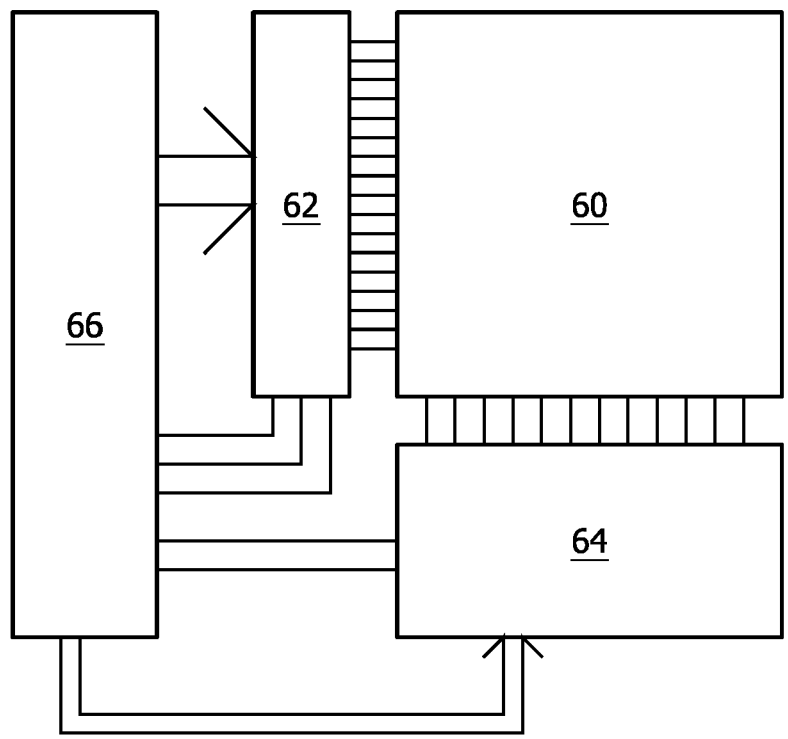

FIG. 6 shows a memory circuit

Figure 1:
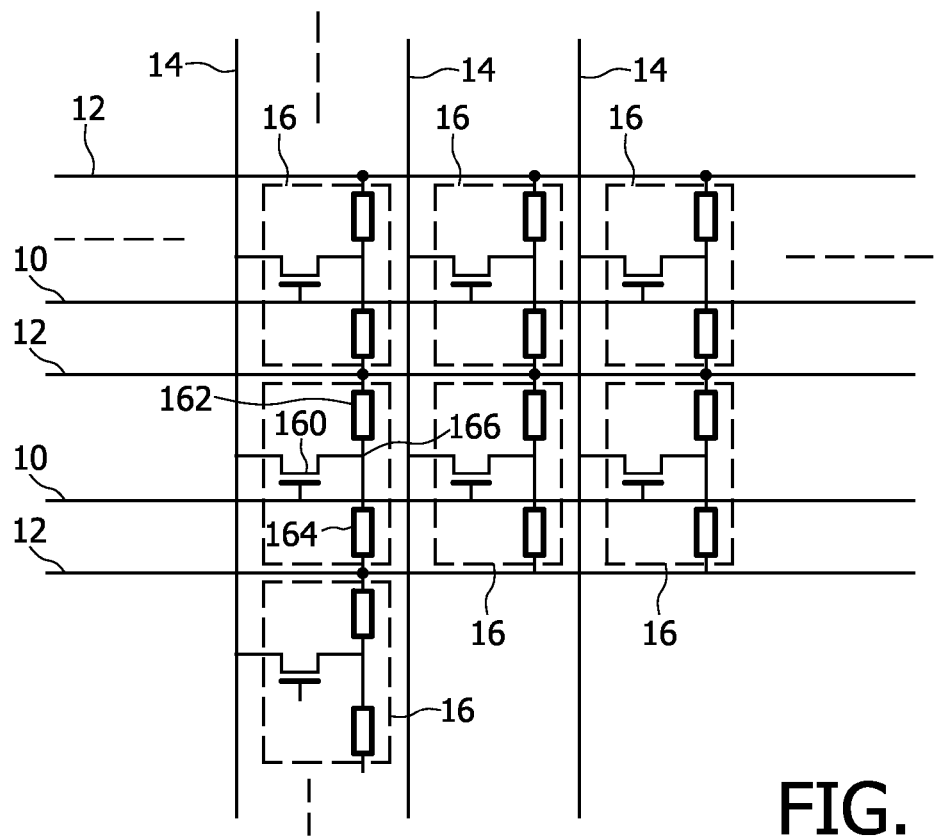
FIG. 1 shows a schematic circuit diagram of a memory matrix

FIG. 1 shows a schematic circuit diagram of a memory matrix. The matrix comprises first and second row conductors 10, 12, column conductors 14 and cells 16. Only part of the rows, columns and cells is shown. Each cell comprises an access transistor 160 and a first and second resistive memory element 162, 164. Components of only one cell are referenced explicitly. Access transistors 160 are realized as vertical transistors. As used herein a resistive memory element is a circuit element with a first and second terminals, between which a current flows when a voltage is applied across the terminals, the value of the current being used as a representation of a stored data value. Examples include fuses and anti-fuses, elements comprising a phase change material etc.

Each first row conductor 10 corresponds to a respective row of cells 16. In each cell 16 access transistor 160 has a control electrode coupled to the first row conductor 10 for the row of the cell 16. Each column conductor 14 corresponds to a respective column of cells 16. In each cell, access transistor 160 has a main current channel coupled between a node 166 in the cell 16 and the column conductor 14 of the column of the cell 16.

Second row conductors 12 correspond to pairs of rows, each successive row forming a respective pair with a preceding one of the rows, so that each pair overlaps with one row of the next pair. Node 166 is coupled to the second row conductors 12 of the pairs of rows to which the cell 16 belongs via first and second resistive memory element 162, 164 respectively.

Only a few rows and columns are shown for the sake of clarity. Of course, cells at the edge of the matrix may be different, containing only one resistive memory element for example, so that a second row conductor can be eliminated. Also cells in some rows or columns may contain fewer resistive memory element for example, for example so that a second row conductor can be eliminated.

Figure 2:
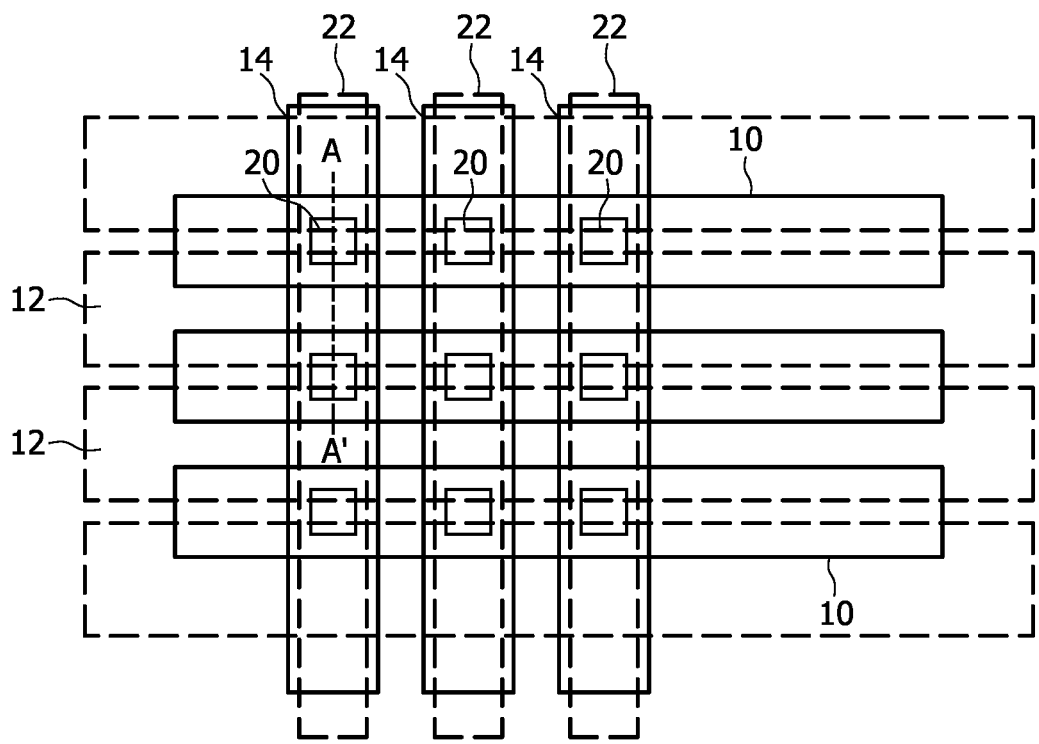
FIG. 2 shows a layout of a memory matrix

FIG. 2 shows a layout of the matrix first and second row conductors 10, 12 are provided in separate layers, so that they can appear to overlap in top view. Similarly column conductors 14 are provided in a separate layer. Each access transistor 160 comprises a channel 20 (shown in top view) that extends through a hole in a first row conductor 10. Alternatively, a channel that passes through an indentation in first row conductor 10, or even adjoining first row conductor 10 may be used. Resistive memory elements 162, 164 are respective part of tracks 22 of resistive memory materials that extend in the column direction. In an embodiment the resistive material is not patterned at all, so that one large sheet of resistive material is used. This embodiment may be used dependent on the material, for example if lateral resistance between cells is relatively largem.

A relatively large pitch is needed for first row conductors 10, to allow for the channels 20 to pass through (or adjacent to) first row conductors 10. This pitch provides room for more than one resistive memory element 162, 164 per pair of first row conductors 10, without requiring a larger pitch, or at least with only a small increase in pitch (less than a doubling of the pitch).

FIG. 3a shows a cross-section of the memory matrix along line A-A' in FIG. 2. Channel 20 is shown to contact column conductor 14 on one of its sides and a track 22 on its other side. In this embodiment the contacts between second row conductors 12 and track 22 are shown to overlap with the interface between channel 20 and track 22. Alternatively the contacts may not overlap, a greater spacing being used between the contacts. A first row conductor 10 (shown in cross section) surrounds channel 20. An isolation layer 30 is provided between first row conductor 10 and channel 20 to act as gate isolation. Second row conductors 12 (shown in cross section) have contacts to track 22 between the contacts to channels of pairs of access transistors. In an embodiment the contact and the second row conductor may be of the same material, deposited in a single step. Isolation layers (not specifically indicated) are provided between column conductor 14, first row conductor 10 and track 22. The horizontal dimension of the various components and the horizontal separation is preferably as small as allowed by manufacturing techniques that allow for electrical conductivity and isolation where needed, or close to these dimensions. The vertical thickness and separation is chosen similarly.

An isolation layers (not indicated explicitly) is also provided between track 22 and second row conductor 12, except where contacts are provided between track 22 and second row conductor 12. In an embodiment an isolation layer may also be provided between track 22 and second row conductor 12, except where contacts are provided between track 22 and second row conductor 12. Similarly isolation material is provided between adjacent pairs of first row conductors 10, adjacent pairs of second row conductors 12 and adjacent tracks 22, e.g. by depositing this isolation material after the conductors or tracks have been defined (e.g. by etching), or by defining space for the conductors or tracks in the isolation material (e.g. by etching) and depositing the conductors/tracks in the defined space. Column conductor 14 may be realized as a diffusion region in a semiconductor substrate, different diffusion regions being separated by current blocking areas; alternatively column conductor 14 may be defined by conductors deposited on any type of substrate.

In an embodiment channel 20 is made of Si. Preferably a thin layer of Ge is provided in the channel between the first row conductor 10 and the column conductor 14 or at the interface between the channel and these conductors. This Ge layer helps to increase the breakdown voltage of access transistors 160, thereby raising the maximum usable operating voltages. Instead of Ge Silicide may be used for example. Track 22 may be made of Si3N4 or SiO2, which act as anti-fuse materials, but any other convenient fuse-material, anti-fuse material of phase change material may be used. Such materials are known per se. Techniques for manufacturing vertical transistors and layers of conductors are also known per se, so these will not be described in detail.

FIG. 3b shows an alternative configuration. In FIG. 3b intermediate conductive areas 32 (e.g. poly silicon) are provided for each access transistor between track 22 and channel 20. The contacts between track 22 and second row conductors 12 at least partly overlap in the horizontal direction with the interface between track 22 and intermediate conductive area 32. Thus, a high electric field strength can easily be realized for programming purposes. A same effect can be realized by broadening channel 20 in the part that forms its drain, at heights beyond where channel 20 passes through first row conductor 10. It may be noted that track 22 need not run on continuously from one transistor to another: the track may be interrupted at a position above channel 20 and/or between adjacent channels 20. In an alternative embodiment, the material of track 22 may not be patterned at all and effectively be one large sheet of resistive material between second row conductor 12 and intermediate conductive areas 32. Furthermore it may be noted that also in the embodiment of FIG. 3a the contacts between track 22 and second row conductors 12 a least partly overlap in the horizontal direction channel 20.

In operation, a read operation is performed by measuring a current through a column conductor 14, while a voltage difference is applied between the second row conductor 12 adjacent a selected row and that column conductor 14, using the first row conductor 10 of the selected row to switch the access transistors 160 in the selected row to a conductive state and the access transistors 160 in other rows to a non conductive state.

FIG. 4 shows voltages during a read operation. Traces 40, 41 show the voltage at first row conductors 10 of selected and non selected rows respectively. Traces 42, 43 show the voltage at of a selected second row conductor 12 and non-selected second row conductors 12 respectively. Trace 44 shows the voltage at the column conductors 14. The voltage at the column conductors 14 substantially equals the voltage at of non-selected second row conductors 12. The voltage difference between the voltage at first row conductors 10 of selected and non selected rows on one hand and the voltage at the column conductors is so that access transistors 160 in selected rows and unselected row are switched to a conductive state and a non-conductive state respectively. Traces 45, 46 show currents flowing through column conductors 14 for columns where respective different digital values are represented by the resistive memory element 162 (or resistive memory element 164, whichever is coupled between the selected second row conductor 12) and the access transistors 160 in the selected row.

It may be noted that this set of voltages causes current to flow between the selected second row conductors 12 and its adjacent second row conductors 12 through resistive memory elements 162, 164. This current does not disturb the column conductor currents, but it does add to power consumption. In a further embodiment the same voltage that is applied to the selected second row conductor 12 is applied to all second row conductors 12 on one side of the selected second row conductor 12, on the side away from the row of conductive access transistors 160. This reduces the extra current. Similarly a same voltage, substantially equal to that of the column conductors 14 may be applied to all second row conductors 12 on the other side of the selected second row conductor 12. Of course, the extra current is also reduced if the applied voltages are not substantially the same, as long as the voltages on the second row conductors 12 on said one side are higher than those on the other side. Although all voltages have been shown to rise and fall at the same time, it should be understood that in practice different relative timing may be used.

Write operations are partly similar to read operations. Access transistors 160 in a row of cells 16 are switched to a conductive state using a first row conductor 10 and a voltage is applied to a second row conductor 12 for the resistive memory elements 162, or 164 to which data must be written. Data dependent (and optionally column address dependent) first ones of the column conductors 14, for cells 16 wherein a first data value must be written are driven to a low voltage level. However, in contrast to read operations the second, remaining ones of column conductors 14 are driven to a higher level to prevent writing. A higher voltage than during read operations is applied to the second row conductor 12 for the resistive memory elements 162, or 164 to which data must be written. This higher voltage is so high that the voltage difference with the first ones of the column conductors 14 is sufficient than to produce an at least semi-irreversible effect on the resistance of the resistive memory elements 162, or 164 (by semi-irreversible effect is meant that the subsequent resistance during read will be different from before and will not change back at least during read operations; herein "resistance" refers to a current value that flows during read). The higher level at the second, remaining ones of column conductors 14 prevents writing by preventing that the sufficient voltage difference develops and/or prevents access transistors 160 to be switched to the conductive state.

The write operations may differ dependent on whether fuse material, anti-fuse material or phase change material is used for resistive memory elements 162, 164.

FIG. 5 shows voltages during a write operation for fuse material. In the case of fuse material a low resistance value is permanently changed to a higher resistance value. The voltages are qualitatively similar to those used during the read operation. A higher voltage 54a is applied to column conductors 14 for columns to which no data is to be written than the voltage 54b applied to column conductors 14 for columns to which data is to be written. Also, the voltage 52 at a selected second row conductor 12 is selected so that a higher voltage difference is realized between the selected second row conductor 12 and the column conductor 14 where data is written than during reading.

In general, it should be prevented that the voltage difference between adjacent second row conductors is so large that sufficient voltage difference develops over both resistive elements 162, 164 in a memory cell 16 to effect an irreversible change in resistance. This can be realized for example by ensuring that the voltage on the selected second row conductor is less than twice the voltage needed to blow fuses, when the unselected second row conductors 12 are driven to the same voltage as the column conductors for which no data is written.

Various options exist for the voltages on the unselected second row conductors 12. For example all other second row conductors 12 may be driven to an intermediate level 53, at a distance from the voltage 52 at the selected second row conductor 12 that is too small to affect irreversible changes. In this case a higher write voltage can be used on the selected second row conductor 12. Alternatively, all second row conductors 12 that are beyond the selected second row conductor 12 on the same side of the selected first row conductor 10 may be driven to the same voltage as the selected second row conductor 12. This saves power. Similarly all second row conductors 12 that are on the opposite side of the selected first row conductor 10 relative to the selected row conductor may be driven to the same voltage, e.g. the intermediate voltage.

The operation for blowing anti-fuse material (effecting a permanent change from high resistance to low resistance) requires more precautions, because of the risk that current through blown anti-fuses causes writing in columns where this is not desired. First a discussion will be devoted to the voltages on the selected first row conductor 10 and what will be called its companion second row conductor 12, which is the second row conductor 12 that is on the opposite side of the selected first row conductor 10 with respect to the selected second row conductor 12.

FIG. 5a shows a voltage level V1 on the selected second row conductor 12 and the voltage level V2 on the companion second row conductor 12. For reference, also the voltage CC on a column conductor 14 is shown for a column wherein data must be written. Furthermore a dashed line shows a voltage level at a distance VT from V1. VT is the minimum voltage drop over a resistive memory element 162, 164 that is needed to blow the anti-fuse.

Traces 58, 59 show the voltage on the drain of access transistor 160, for the cases wherein the resistive memory element 162, 164 between the drain and the companion second row conductor 12 has already been blown and has not been blown yet. In the Figure it has been assumed that access transistor 160 is switched to the conductive state while the voltages on the conductors remain constant. As can be seen, in the case of a blown anti-fuse the drain voltage 58 is initially (when access transistor 160 is not yet in the non-conductive state) close to the voltage V2 on the companion second row conductor 12 because the relevant resistive memory element 162, 164 has a low resistance. In the case of a not-blown anti-fuse the drain voltage 58 is initially halfway between the voltages V1 and V2 on the selected second row conductor 12 and the companion second row conductor 12 because the relevant resistive memory elements 162, 164 both have a high resistance.

The voltage V2 on the companion second row conductor 12 is selected so close to the voltage V1 on the selected second row conductor 12 that no irreversible change occurs when access transistor 160 is not yet in the non-conductive state.

When access transistor 160 is switched to the conductive state the drain voltage in both traces 58, 59 drops. When the adjacent resistive memory element 162, 164 between the drain and the companion second row conductor 12 has been blown earlier, the voltage drop DV is smallest. The voltages, the access transistor and the resistive memory element 162, 164 are designed so that the voltage drop DV causes the drain voltage to drop below V1-VT, so as to blow the anti-fuse in the case when the adjacent resistive memory element 162, 164 has a low resistance value because it has been blown earlier.

As will be appreciated this implies that blowing will occur also if the adjacent resistive memory element 162, 164 has not yet been blown. To ensure that this adjacent resistive memory element 162, 164 will not be blown by accident the voltage V2 at the companion second row conductor 12 is not made larger than a maximum which would cause VT to be exceeded over the adjacent resistive memory element 162, 164. In one example this is realized by taking $$V1-CC=2*(V2-CC)$$

and 2*(V1−CC)>VT and (V2−VCC)<VT. However, it should be noted that other voltage values may be used as well to avoid inadvertent writing.

Here it has been assumed that V1, V2 and CC are always the same. However, of course different V1, V2, CC may be used if the "companion" memory cells have not been programmed yet, or when all "companion" memory cells have been programmed already. This might facilitate the selection of voltages.

Of course, care should also be taken that no writing occurs to resistive memory elements 162, 164 that are connected to access transistors 162 in unselected rows. As in the case of fuses, this may be realized by making the voltages at the second row conductors 12 on one side of the selected second row conductor 12 all equal to that on the selected second row conductor 12 and on the other side equal to the voltage on the companion second row conductor 12, or by making all voltage on the other second row conductors 12 equal to that on the equal to that on the companion second row conductor 12.

When resistive memory elements 162, 164 are of a type that allows for semi-permanent resistance changes in back and forth from low to high resistance and back, such as materials that exhibit phase changes or hysteresis, both types of writing (fuse and anti-fuse) may be used. Alternatively, however, one of these types of writing e.g. anti-fuse writing may be realized collectively for all columns, by placing a sufficiently large voltage difference across a pair of adjacent second row conductors, so as to "erase" the content of resistive memory elements 162, 164 in a row of memory cells 16.

FIG. 6 shows a memory circuit. The memory circuit comprises a matrix 60 as described in the preceding, a row selection circuit 62 and a column circuit 64. Row selection circuit 62 is coupled to the first and second row conductors 10, 12 of matrix 60. In an embodiment column circuit 64 contains a read circuit optionally a write circuit coupled to the column conductors 14 of matrix 60.

Row selection circuit 62 has a row address input, a read voltage input, a write voltage input and read, write control inputs. Column circuit 64 has a read/write control input and optionally also a column address input. A data processing circuit 66 has address outputs coupled at least to row selection circuit 62, read data inputs coupled to column selection circuit 64 and optional write data outputs coupled to column selection circuit 64 (the latter may be combined with the read inputs).

In operation during read operations row selection circuit 62 applies voltages to first and second row conductors 10, 12 as described, row selection circuit 62 determining the selected first and second row conductors 10, 12 dependent on a received address. During the read operation column circuit 64 senses currents through column conductors 14 and decides with data values correspond to these currents. Typically a binary data value (one or zero) is selected, but in an advanced embodiment a selection between more than two digital data values, corresponding to different current ranges may be used.

When write operations are supported row selection circuit 62 applies voltages to first and second row conductors 10, 12 as described. During the read operation column circuit 64 drives data dependent column conductors 14 to write and non-write voltages respectively. Details of the write operation depend on the type of resistive memory element that is used. In the case of fuses or anti-fuses it suffices to apply a voltage to blow the (anti-)fuses. In the case of phase change materials it may be necessary to apply a waveform (e.g. with a slow or abrupt decline) to leave the material in a selected state, using techniques which are known per se. Optionally, a separate erase operation is performed, wherein a row of memory elements is brought to the same state, followed by a write operation wherein cells in selected columns of the row are brought to a different state.

As a further alternative, resistive memory elements 162, 164 may be used that have a hysteresis effect. Such elements are well known. Elements with a hysteresis effect exhibit a resistance that depends on the sign of the last applied large voltage. When hysteresis effects are used negative pulses may be applied, wherein the voltages at column conductors 14 are raised above those of second row conductors 12 in order to apply a reverse voltage across resistive memory elements 162, 164.

Although specific embodiments have been described it should be appreciated that alternatives are possible. For example in one embodiment the circuit may be realized "upside down", with second row conductors 12 in a substrate and column conductors 14 on top. As another example transistors of a different conductivity type may be used, together with voltage differences of an opposite polarity compared to that of the examples.

The invention claimed is:

1. An electronic circuit, comprising a memory matrix comprising rows and columns of memory cells, the matrix comprising:
   first row conductors for each of the rows, each first row conductor corresponding to a respective row of cells;
   second row conductors corresponding to pairs of rows, each successive row forming a respective pair with a preceding one of the rows, so that each pair overlaps with one row of the next pair and;
   column conductors for each of the columns,
      wherein each of said memory cells comprises
      an access transistor,
      a node and
      a first and second resistive memory element,
         wherein the access transistor has a control electrode electrically coupled to the first row conductor of the row of the memory cell, a main current channel electrically coupled between the column conductor for the column of the memory cell and the node, the first and the second resistive memory element are electrically coupled between the node and the second row conductors for the pairs of rows to which the memory cell belongs.

2. An electronic circuit according to claim 1, wherein the access transistors are realized as vertical transistors, the main current channel extending transverse to the first and second row conductors and the column conductors, crossing the first row conductors so that the first row conductors act as gate electrodes for the access transistors, the column conductors and the second row conductors each lying in a respective plane on mutually opposite sides of the first row conductors, a region or regions comprising resistive memory material lying between the main current channels and the second row conductors.

3. An electronic circuit according to claim 2, wherein the column conductors comprise respective parallel doped areas in a semi-conductor substrate on which a remainder of the circuit is deposited.

4. An electronic circuit according to claim 2, wherein the second row conductors comprise respective parallel doped areas in a semi-conductor substrate on which a remainder of the circuit is deposited.

5. An electronic circuit according to claim 2, comprising intermediate conductive regions between respective ones of the main current channels and the region or regions comprising resistive memory material, the intermediate conductive regions being wider than the main current channels at least in a column direction.

6. An electronic circuit according to claim 1, comprising a read circuit coupled to the first and second row conductors and the column conductors, the read circuit being arranged to read a row of memory cells by:
   driving a selection voltage level to the first row conductor of a selected one of the rows and a non-selection voltage level to the first row conductors of the remaining ones of the rows;
   driving a mutually different first and second voltage to all second row conductors on mutually opposite sides of the selected one of the rows respectively;
   measuring a current flowing through at least one of the column conductors.

7. An electronic circuit according to claim 1, comprising a write circuit coupled to the first and second row conductors and the column conductors, the write circuit being arranged to write to the resistive memory elements in a selected row of memory cells by:

driving a selection voltage level to the first row conductor of the selected row and a non-selection voltage level to the first row conductors of the remaining ones of the rows;

driving mutually different first and second voltages to second row conductors coupled to the first and second resistive memory elements of the memory cells in the selected row respectively;

driving data dependent voltages to the column conductors.

8. An electronic circuit according to claim 1, comprising a row selection circuit coupled to the first and second row conductors and arranged to erase information from the first and second resistive memory elements of the memory cells in a selected row by applying a voltage difference between the second row conductors coupled to the first and second resistive memory elements of the memory cells in the selected row.

9. An electronic circuit according to claim 1, wherein the first and second resistive memory elements comprise a fuse material or an anti-fuse material, which exhibits an irreversible change of resistance after applying a voltage above a threshold voltage across the resistive memory element.

10. An electronic circuit according to claim 1, wherein the first and second resistive memory elements comprise phase change material, which exhibits a resistance dependent on a write waveform applied across the resistive memory element.

11. An electronic circuit according to claim 1, wherein the first and second resistive memory elements comprise material with a hysteresis property, which exhibits a resistance dependent on a sign of a last write voltage applied across the resistive memory element.

\* \* \* \* \*